(12) United States Patent
Chen et al.

(10) Patent No.: US 10,651,204 B2
(45) Date of Patent: May 12, 2020

(54) ARRAY SUBSTRATE, ITS MANUFACTURING METHOD AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Chuanbao Chen, Beijing (CN); Yan Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 302 days.

(21) Appl. No.: 15/141,532

(22) Filed: Apr. 28, 2016

(65) Prior Publication Data

US 2016/0343735 A1 Nov. 24, 2016

(30) Foreign Application Priority Data

May 20, 2015 (CN) .......................... 2015 1 0260761

(51) Int. Cl.
*H01L 27/12* (2006.01)
*G02F 1/1362* (2006.01)
*G02F 1/1343* (2006.01)

(52) U.S. Cl.
CPC ...... *H01L 27/124* (2013.01); *G02F 1/136286* (2013.01); *H01L 27/1259* (2013.01); *G02F 2001/134372* (2013.01); *G02F 2201/40* (2013.01)

(58) Field of Classification Search
CPC .................... H01L 27/1218; H01L 27/1259
USPC ................. 438/151, 155, 618; 257/59, 72
See application file for complete search history.

(56) References Cited

U.S. PATENT DOCUMENTS

| | | | |
|---|---|---|---|
| 9,123,592 B1 * | 9/2015 | Zhang | H01L 27/124 |
| 9,490,271 B2 * | 11/2016 | Li | G02F 1/133345 |
| 9,898,968 B2 * | 2/2018 | Zhang | H01L 27/3276 |
| 2012/0127414 A1 * | 5/2012 | Shin | G06F 3/0412 |
| | | | 349/139 |

(Continued)

FOREIGN PATENT DOCUMENTS

| | | |
|---|---|---|
| CN | 102208434 A | 10/2011 |
| CN | 103456747 A | 12/2013 |

(Continued)

OTHER PUBLICATIONS

First Office Action for Chinese Application No. 201510260761.5, dated May 31, 2017, 8 Pages.

(Continued)

*Primary Examiner* — Jamie C Niesz
(74) *Attorney, Agent, or Firm* — Brooks Kushman P.C.

(57) ABSTRACT

An array substrate, a method for manufacturing the array substrate and a display device are provided. The array substrate includes a gate electrode, a gate line, a gate insulation layer, a source electrode, a drain electrode, a data line, a common electrode and a common electrode line arranged on base substrate. The common electrode line is directly connected to the common electrode.

13 Claims, 3 Drawing Sheets

(56) References Cited

U.S. PATENT DOCUMENTS

| | | | | |
|---|---|---|---|---|
| 2013/0149043 A1* | 6/2013 | LaCroix | ................ | B28B 3/021 |
| | | | | 405/284 |
| 2015/0123136 A1* | 5/2015 | Kim | ................... | G02F 1/13454 |
| | | | | 257/72 |
| 2015/0372015 A1* | 12/2015 | Cheng | ................. | H01L 27/124 |
| | | | | 257/71 |
| 2016/0293628 A1 | 10/2016 | Ning | | |
| 2016/0370945 A1* | 12/2016 | Qu | ........................ | G06F 3/041 |

FOREIGN PATENT DOCUMENTS

| | | | | |
|---|---|---|---|---|
| CN | 104217994 A | | 12/2014 | |
| CN | 204028524 U | * | 12/2014 | ........... H01L 27/124 |
| JP | 2013210652 A | | 10/2013 | |

OTHER PUBLICATIONS

Second Office Action for Chinese Application No. 201510260761.5, dated Nov. 23, 2017, 6 Pages.

\* cited by examiner

ARRAY SUBSTRATE, ITS MANUFACTURING METHOD AND DISPLAY DEVICE

CROSS-REFERENCE TO RELATED APPLICATION

The present application claims a priority of the Chinese patent application No. 201510260761.5 filed on May 20, 2015, which is incorporated herein by reference in its entirety.

TECHNICAL FIELD

The present disclosure relates to the field of display technology, in particular to an array substrate, its manufacturing method and a display device.

BACKGROUND

Along with the development of the thin film transistor (TFT) industry and manufacture process, an Advanced Super Dimension Switch (ADSDS, ADS for short) wide-viewing angle technology, as a competitive technology, has attracted more and more attention and has thus been widely applied to various products, such as mobile phones, digital cameras, flat-panel computers, laptop computers and liquid crystal televisions.

The ADS technology may be described as forming a multi-dimensional electric field by means of electrical fields generated at edges of slit electrodes within an identical plane and an electrical field generated between a slit electrode layer and a plate electrode layer, so as to enable all the liquid crystal molecules between the slit electrodes and right above the electrodes within a liquid crystal cell to rotate, thereby to improve the operational efficiency of the liquid crystal molecules and enhance the light transmission efficiency. The ADS technology may be used to improve the image quality of a thin film transistor-liquid crystal display (TFT-LCD) product, and has such advantages as high resolution, high transmittance, low power consumption, wide viewing angle, high aperture ratio, low chromatic aberration and being free of push Mura.

Usually, for a conventional ADS-mode array substrate, a common electrode line is manufactured by a gate metal layer, a common electrode is manufactured by a transparent conductive layer, and the common electrode line is connected to the common electrode through via-holes at a pixel region. However, there are a large number of via-holes, so an aperture ratio of a display device may be adversely affected. In addition, the common electrode line is lapped onto the common electrode through the via-hole, so imperfect contact may occur at the via-hole, and the image quality will be adversely affected.

SUMMARY

An object of the present disclosure is to provide an array substrate, its manufacturing method and a display device, so as to improve an aperture ratio of the display device, optimize the connection between a common electrode and a common electrode line, and improve the image quality.

In one aspect, the present disclosure provides in some embodiments an array substrate, including a gate electrode, a gate line, a gate insulation layer, a source electrode, a drain electrode, a data line, a common electrode, and a common electrode line which are arranged on a base substrate. The common electrode line is directly connected to the common electrode.

Alternatively, the common electrode line is arranged at a layer and made of a material identical to the source electrode, the drain electrode and the data line.

Alternatively, two adjacent common electrode lines in a direction parallel to the gate line are electrically connected to each other through a jumper wire.

Alternatively, the jumper wire is arranged in an extension direction of the common electrode line electrically connected to the jumper wire.

Alternatively, the jumper wire is a metal wire, and arranged at a layer and made of a material identical to the gate electrode and the gate line.

Alternatively, the two adjacent common electrode lines arranged in the direction parallel to the gate line are electrically connected to each other by the jumper wire through a first via-hole and a second via-hole, and the first via-hole and the second via-hole are arranged below the common electrode lines respectively and penetrate through the gate insulation layer.

Alternatively, a further common electrode line for connecting the common electrode line to the jumper wire is arranged within each of the first via-hole and the second via-hole.

Alternatively, a further common electrode for connecting the common electrode line to the jumper wire is arranged within each of the first via-hole and the second via-hole.

In another aspect, the present disclosure provides in some embodiments a display device including the above-mentioned array substrate.

In yet another aspect, the present disclosure provides in some embodiments a method for manufacturing an array substrate. The array substrate includes a gate electrode, a gate line, a gate insulation layer, a source electrode, a drain electrode, a data line, a common electrode and a common electrode line which are arranged on a base substrate. The method includes a step of forming the common electrode line and the common electrode directly connected to each other.

Alternatively, the method further includes forming the source electrode, the drain electrode, the data line and the common electrode line through a single patterning process.

Alternatively, the method further includes forming a jumper wire for electrically connecting the two adjacent common electrode lines arranged in a direction parallel to the gate line.

Alternatively, the method further includes forming the gate electrode, the gate line and the jumper wire through a single patterning process.

Alternatively, the method further includes forming a first via-hole and a second via-hole penetrating through the gate insulation layer. The first via-hole and the second via-hole are arranged below the common electrode lines respectively, and the two adjacent common electrode lines arranged in the direction parallel to the gate line are electrically connected to each other by the jumper wire through the first via-hole and the second via-hole.

Alternatively, the step of forming the first via-hole and the second via-hole includes, subsequent to the formation of the gate insulation layer, patterning the gate insulation layer to form the first via-hole and the second via-hole.

Alternatively, in the case of forming the common electrode line, the common electrode line is connected to the jumper wire through a further common electrode line formed in each of the first via-hole and the second via-hole.

The step of forming the first via-hole and the second via-hole includes, subsequent to the formation of the common electrode line, patterning the gate insulation layer to form the first via-hole and the second via-hole.

Alternatively, in the case of forming the common electrode, the common electrode line is connected to the jumper wire through a further common electrode formed in each of the first via-hole and the second via-hole.

In still yet another aspect, the present disclosure provides in some embodiments a method for manufacturing an array substrate, including: Step S1 of providing a base substrate, and forming a gate line, a jumper wire and a gate electrode on the base substrate through a single patterning process; Step S2 of forming a gate insulation layer provided with a via-hole on the base substrate obtained after Step S1; Step S3 of forming a pattern of a semiconductor layer on the base substrate obtained after Step S2; Step S4 of forming a source electrode, a drain electrode, a data line and a common electrode line on the base substrate obtained after Step S3; Step S5 of forming a pattern of a common electrode on the base substrate obtained after Step S4; Step S6 of forming a passivation layer with a via-hole on the base substrate obtained after Step S5; and Step S7 of forming a pattern of a pixel electrode on the base substrate obtained after Step S6.

According to the embodiments of the present disclosure, the common electrode and the common electrode line of the array substrate are directly connected to each other, rather than through a via-hole, so it is unnecessary to provide the via-hole for connecting the common electrode line and the common electrode. As a result, it is able to improve an aperture ratio of the display device, optimize the connection between the common electrode and the common electrode line, and improve the image quality.

DETAILED DESCRIPTION OF THE EMBODIMENTS

Figure 1:
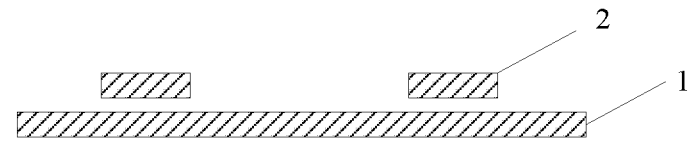
FIG. 1 is a schematic view showing a structure where a gate line and a jumper wire are formed according to one embodiment of the present disclosure.
Figure 1:

In order to make the objects, the technical solutions and the advantages of the present disclosure more apparent, the present disclosure will be described hereinafter in conjunction with the drawings and embodiments.

In the related art, a common electrode line is connected to a common electrode through a via-hole, so there are a large number of via-holes at a pixel region, and an aperture ratio of a display device may be adversely affected. In addition, the common electrode line is lapped onto the common electrode through the via-hole, so imperfect contact may occur at the via-hole, and the image quality will be adversely affected. In order to overcome these drawbacks, the present disclosure provides in some embodiments an array substrate, its manufacturing method and a display device, so as to improve an aperture ratio of the display device, optimize the connection between a common electrode and a common electrode line, and improve the image quality.

The present disclosure provides in some embodiments an array substrate, which includes a gate electrode, a gate line, a gate insulation layer, a source electrode, a drain electrode, a data line, a common electrode and a common electrode line arranged on a base substrate. The common electrode line is directly connected to the common electrode.

According to the embodiments of the present disclosure, the common electrode and the common electrode line of the array substrate are directly connected to each other, rather than through a via-hole, so it is unnecessary to provide the via-hole for connecting the common electrode line and the common electrode. As a result, it is able to improve an aperture ratio of the display device, optimize the connection between the common electrode and the common electrode line, and improve the image quality.

In an alternative embodiment, the common electrode line is arranged at a layer and made of a material identical to the source electrode, the drain electrode and the data line. In this way, it is able to form the common electrode line, the source electrode, the drain electrode and the data line through a single patterning process, thereby to reduce the number of the patterning processes for manufacturing the array substrate. Two adjacent common electrode lines in a direction parallel to the gate line are electrically connected to each other through a jumper wire.

Alternatively, the jumper wire is arranged in an extension direction of the common electrode line electrically connected to the jumper wire. In this way, it is able to minimize a length of the jumper wire, thereby to save a material for forming the jumper wire and prevent the other wires from being adversely affected by the jumper wire as possible.

In an alternative embodiment, the jumper wire is a metal wire, and arranged at a layer and made of a material identical to the gate electrode and the gate line. In this way, it is able to forming the jumper wire, the gate electrode and the gate line through a single patterning process, thereby to reduce the number of the patterning processes for forming the array substrate.

Alternatively, the two adjacent common electrode lines arranged in the direction parallel to the gate line are electrically connected to each other by the jumper wire through a first via-hole and a second via-hole, and the first via-hole and the second via-hole are arranged below the common electrode lines respectively and penetrate through the gate insulation layer. Because the first via-hole and the second via-hole are arranged below the common electrode lines respectively, it is able to prevent the aperture ratio of the display device from being adversely affected.

In the case that the gate insulation layer is formed and is further processed by a patterning process, the first via-hole and the second via-hole may be formed by the patterning process. Then, during the formation of the common electrode line, the common electrode line is connected to the jumper wire through a further common electrode line formed within each of the first via-hole and the second via-hole. In other words, the further common electrode line for connecting the common electrode line to the jumper wire is arranged within each of the first via-hole and the second via-hole.

In the case that the gate insulation layer is formed and is not processed by a patterning process, the first via-hole and the second via-hole may be formed through a patterning process for forming the common electrode line and the data line. Then, during the formation of the common electrode, the common electrode line is connected to the jumper wire through a further common electrode formed within each of the first via-hole and the second via-hole. In other words, the further common electrode for connecting the common electrode line to the jumper wire is arranged within each of the first via-hole and the second via-hole.

The present disclosure further provides in some embodiments a display device which includes the above-mentioned array substrate. The display device may be any product or member having a display function, such as a liquid crystal panel, a liquid crystal television, a liquid crystal display, a digital photo frame, a mobile phone, a flat-panel computer, a navigator or an electronic paper.

The present disclosure further provides in some embodiments a method for manufacturing an array substrate. The array substrate includes a gate electrode, a gate line, a gate insulation layer, a source electrode, a drain electrode, a data line, a common electrode and a common electrode line arranged on a base substrate. The method includes a step of forming the common electrode line and the common electrode directly connected to each other.

According to the embodiments of the present disclosure, the common electrode and the common electrode line of the array substrate are directly connected to each other, rather than through a via-hole, so it is unnecessary to provide the via-hole for connecting the common electrode line and the common electrode. As a result, it is able to improve an aperture ratio of the display device, optimize the connection between the common electrode and the common electrode line, and improve the image quality.

In an alternative embodiment, the method further includes forming the source electrode, the drain electrode, the data line and the common electrode line through a single patterning process. In this way, it is able to reduce the number of the patterning processes for manufacturing the array substrate.

Alternatively, the method further includes forming a jumper wire for electrically connecting the two adjacent common electrode lines arranged in a direction parallel to the gate line. The jumper wire is arranged in an extension direction of the common electrode line electrically connected to the jumper wire. In this way, it is able to minimize a length of the jumper wire, thereby to save a material for forming the jumper wire and prevent the other wires from being adversely affected the jumper wire as possible.

In an alternative embodiment, the jumper wire may be a metal wire, and the method further includes forming the gate electrode, the gate line and the jumper wire through a single patterning process. In this way, it is able to reduce the number of the patterning processes for manufacturing the array substrate.

Alternatively, the method further includes forming a first via-hole and a second via-hole penetrating through the gate insulation layer. The first via-hole and the second via-hole are arranged below the common electrode lines respectively, and the two adjacent common electrode lines arranged in the direction parallel to the gate line are electrically connected to each other by the jumper wire through the first via-hole and the second via-hole. Because the first via-hole and the second via-hole are arranged below the common electrode lines respectively, so it is able to prevent the aperture ratio of the display device from being adversely affected.

In the case that the gate insulation layer is formed and is further processed by a patterning process, the first via-hole and the second via-hole may be formed through the patterning process. To be specific, the step of forming the first via-hole and the second via-hole includes, subsequent to the formation of the gate insulation layer, processing the gate insulation layer by a single patterning process to form the first via-hole and the second via-hole. Then, during the formation of the common electrode line, the common electrode line is connected to the jumper wire through a further common electrode line formed within each of the first via-hole and the second via-hole. In other words, the further common electrode for connecting the common electrode line to the jumper wire is arranged within each of the first via-hole and the second via-hole.

In the case that the gate insulation layer is formed and is not further processed by a patterning process, the first via-hole and the second via-hole may be formed through a patterning process for forming the common electrode line and the data line. To be specific, the step of forming the first via-hole and the second via-hole includes, subsequent to the formation of the common electrode line, patterning the gate insulation layer to form the first via-hole and the second via-hole. Then, during the formation of the common electrode, the common electrode line is connected to the jumper wire through a further common electrode formed within each of the first via-hole and the second via-hole. In other words, the further common electrode for connecting the common electrode line to the jumper wire is arranged in each of the first via-hole and the second via-hole.

The method for manufacturing the array substrate will be described hereinafter in conjunction with the drawings, and it may include the following steps.

Step S1: providing a base substrate, and forming a gate line 1, a jumper wire 2 and a gate electrode on the base substrate through a single patterning process. The base substrate may be a glass or quartz substrate. To be specific, as shown in FIG. 1, a gate metal layer having a thickness of 2500 to 16000 Å may be deposited onto the base substrate by sputtering or thermal evaporation. The gate metal layer may be made of Cu, Al, Ag, Mo, Cr, Nd, Ni, Mn, Ti, Ta, W or an alloy thereof, and it may be of a single-layered structure, or a multi-layered structure such as Cu/Mo, Ti/Cu/Ti or Mo/Al/Mo. A photoresist may be applied onto the gate metal layer, and then exposed with a mask plate, so as to form a photoresist reserved region corresponding to a region where a pattern of the gate metal layer is located, and a photoresist unreserved region corresponding to the other region. Next, the photoresist may be developed, so as to fully remove the photoresist at the photoresist unreserved region and maintain a thickness of the photoresist at the photoresist reserved region unchanged. Then, a gate metal film at the photoresist unreserved region may be fully etched off, and the remaining photoresist may be removed, so as to form the pattern of the gate metal layer. The pattern of the gate metal layer includes the gate line 1, the jumper wire 2 and the gate electrode (not shown).

Step S2: forming a gate insulation layer 7 provided with a via-hole 3 on the base substrate obtained after Step S1. To be specific, the gate insulation layer 7 having a thickness of 500 to 5000 Å may be deposited onto the base substrate obtained after Step S1 through plasma enhanced chemical vapor deposition (PECVD). The gate insulation layer 7 may be made of an oxide, a nitride or an oxynitride. Then, the gate metal layer 7 may be etched by a dry etching method with a reactant gas mixture of $SiH_4$, $NH_3$ and $N_2$, or $SiH_2Cl_2$, $NH_3$ and $N_2$, so as to form the gate insulation layer 6 provided with the via-hole 3.

Step S3: forming a pattern of a semiconductor layer on the base substrate obtained after Step S2. To be specific, the semiconductor layer having a thickness of 500 to 5000 Å may be deposited onto the base substrate obtained after Step S2. A photoresist may be applied onto the semiconductor layer, and then exposed with a mask plate, so as to form a photoresist reserved region corresponding to a region where the pattern of the semiconductor layer is located, and a photoresist unreserved region corresponding to the other region. Next, the photoresist may be developed, so as to fully remove the photoresist at the photoresist unreserved region and maintain a thickness of the photoresist at the photoresist reserved region unchanged. Then, a gate metal layer at the photoresist unreserved region may be fully etched off and the remaining photoresist may be removed, so as to form the pattern of the semiconductor layer 6.

Figure 2:
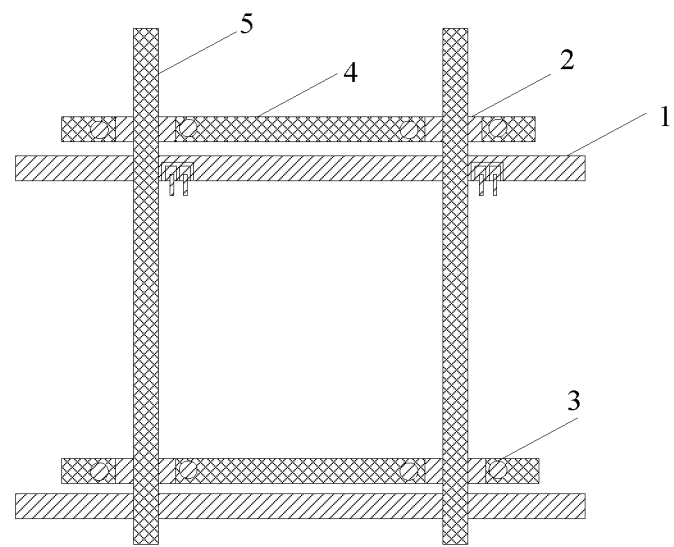
FIG. 2 is a schematic view showing a structure where a data line and a common electrode line are formed according to one embodiment of the present disclosure.

Step S4: forming a source electrode, a drain electrode, a data line 5 and a common electrode line 4 on the base substrate obtained after Step S3. To be specific, as shown in FIG. 2, a source/drain metal layer having a thickness of 2000 to 4000 Å may be deposited onto the base substrate obtained after Step S3 by magnetron sputtering, thermal evaporation or any other film-forming method. The source/drain metal layer may be made of Cu, Al, Ag, Mo, Cr, Nd, Ni, Mn, Ti, Ta, W, or an alloy thereof, and it may be of a single-layered structure, or a multi-layered structure such as Cu/Mo, Ti/Cu/Ti or Mo/Al/Mo. A photoresist may be applied onto the source/drain metal layer, and then exposed with a mask plate, so as to form a photoresist reserved region corresponding to a region where patterns of the source electrode, the drain electrode, the data line 5 and the common electrode line 4 are located, and a photoresist unreserved region corresponding to the other region. Next, the photoresist may be developed, so as to fully remove the photoresist at the photoresist unreserved region and maintain a thickness of the photoresist at the photoresist reserved region unchanged. Then, the source/drain metal layer at the photoresist unreserved region may be fully etched off and the remaining photoresist may be removed, so as to form the source electrode (not shown), the drain electrode (not shown), the data line 5 and the common electrode line 4. It can be seen that, the jumper wire 2 is arranged in an extension direction of the common electrode line 4, and the common electrode line 4 is connected to the jumper wire 2 through the via-hole 3, so the adjacent common electrode lines 4 may be connected to each other through the jumper wire 2. In addition, the via-hole 3 is arranged below the common electrode line 4, so the aperture ratio of the display device may not be adversely affected.

Figure 3:
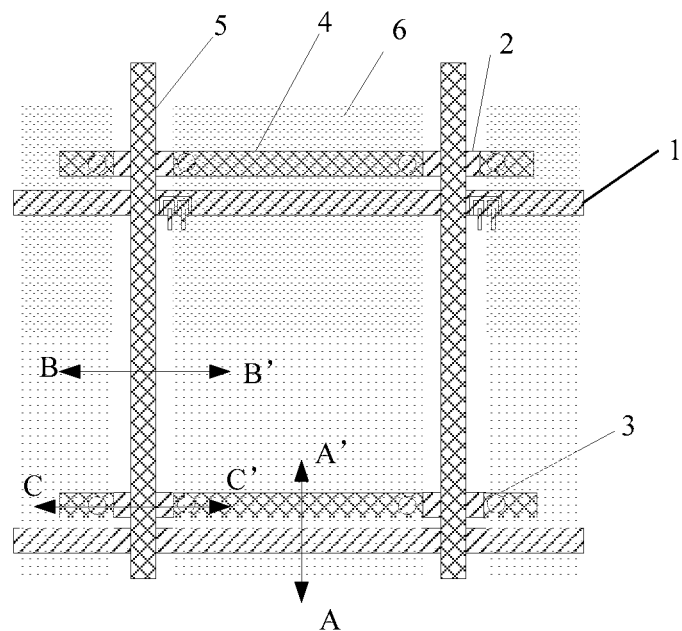
FIG. 3 is a schematic view showing a structure where a common electrode is formed according to one embodiment of the present disclosure.

Step S5: forming a pattern of a common electrode 6 on the base substrate obtained after Step S4. To be specific, as shown in FIG. 3, a transparent conductive layer having a thickness of about 300 to 1500 Å may be deposited onto the base substrate obtained after Step S4 by sputtering or thermal evaporation. The transparent conductive layer may be made of indium tin oxide (ITO), indium zinc oxide (IZO) or any other transparent metal oxide. A photoresist may be applied onto the transparent conductive layer, and then exposed with a mask plate, so as to form a photoresist reserved region corresponding to a region where the pattern of the common electrode 6 is located, and a photoresist unreserved region corresponding to the other region. Next, the photoresist may be developed, so as to fully remove the photoresist at the photoresist unreserved region and maintain a thickness of the photoresist at the photoresist reserved region unchanged. Then, the transparent conductive layer at the photoresist unreserved region may be fully etched off and the remaining photoresist may be removed, so as to form the pattern of the common electrode 6.

Figure 4:
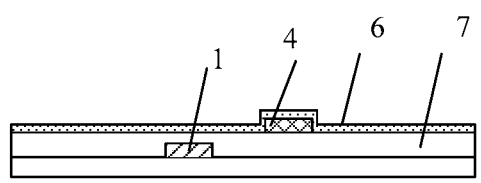
FIG. 4 is a sectional view of the structure in FIG. 3 along line AA'.
Figure 5:
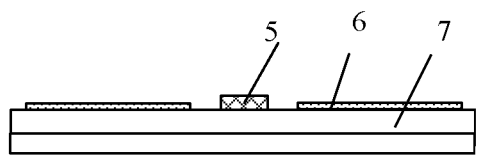
FIG. 5 is another sectional view of the structure in FIG. 3 along line BB'.
Figure 6:
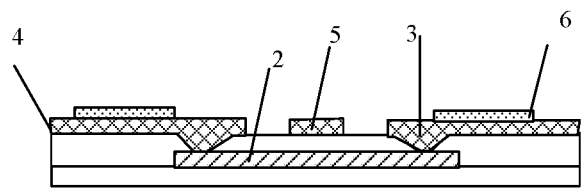
FIG. 6 is yet another sectional view of the structure in FIG. 3 along line CC'.

As shown in FIGS. 4-6, the common electrode 6 is directly connected to the common electrode line 4, so as to electrically connect the common electrodes on the array substrate to each other. Because the common electrode 6 is not connected to the common electrode line 4 through the via-hole, so it is able to optimize the connection between the common electrode 6 and the common electrode line 4, thereby to improve the image quality.

Step S6: forming a passivation layer provided with a via-hole on the base substrate obtained after Step S5. To be specific, the passivation layer 8 having a thickness of 200 to 1000 Å may be deposited onto the base substrate obtained after Step S5 by magnetron sputtering, thermal evaporation, PECVD or any other film-forming method. The passivation layer 8 may be made of an oxide, a nitride or an oxynitride, and specifically it may be made of SiNx, SiOx, Si(ON)x or $Al_2O_3$. The passivation layer 8 may be of a single-layered structure, or a double-layered structure consisting of a SiNx layer and a SiOx layer. A reactant gas mixture corresponding to SiOx may include $SiH_4$ and $N_2O$, and a reactant gas mixture corresponding to SiNx or Si(ON)x may include $SiH_4$, $NH_3$ and $N_2$, or $SiH_2Cl_2$, $NH_3$ and $N_2$. Then, the pattern of the passivation layer 9 provided with the via-hole may be formed through a single patterning process.

Step S7: forming a pattern of a pixel electrode 9 on the base substrate obtained after Step S6. To be specific, a transparent conductive layer having a thickness of about 300 to 1500 Å may be deposited onto the base substrate obtained after Step S6 by sputtering or thermal evaporation. The transparent conductive layer may be made of ITO, IZO or any other transparent metal oxide. A photoresist may be applied onto the transparent conductive layer, and then exposed with a mask plate, so as to form a photoresist reserved region corresponding to a region where the pattern of the pixel electrode 9 is located, and a photoresist unreserved region corresponding to the other region. Next, the photoresist may be developed, so as to fully remove the photoresist at the photoresist unreserved region and maintain a thickness of the photoresist at the photoresist reserved region unchanged. Then, the transparent conductive layer at the photoresist unreserved region may be fully etched off and the remaining photoresist may be removed, so as to form the pattern of the pixel electrode 9. The pixel electrode 9 is connected to the drain electrode through the via-hole in the passivation layer.

Figure 7:
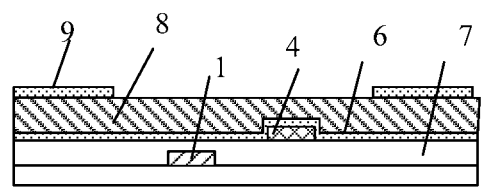
FIG. 7 is a sectional view of an array substrate along line AA' according to one embodiment of the present disclosure.
Figure 8:
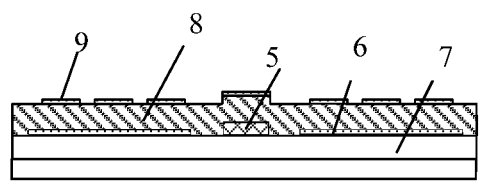
FIG. 8 is another sectional view of the array substrate along line BB' according to one embodiment of the present disclosure.
Figure 9:
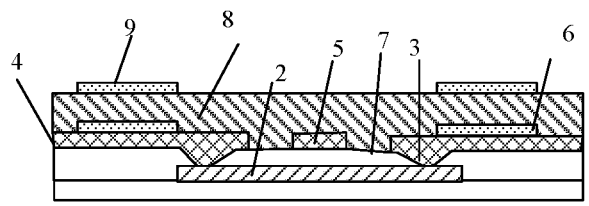
FIG. 9 is yet another sectional view of the array substrate along line CC' according to one embodiment of the present disclosure.

The array substrate in the embodiments of the present disclosure may be manufactured through the above-mentioned steps, and FIGS. 7, 8 and 9 are sectional views of the array substrate along lines AA', BB' and CC'. In the embodiments of the present disclosure, the via-hole for connecting the common electrode line and the jumper wire is arranged below the common electrode line, so the aperture ratio of the display device may not be adversely affected. In addition, the common electrode is directly connected to the common electrode line, rather than through the via-hole, so it is unnecessary to provide the via-hole for connecting the common electrode line to the common electrode, thereby it is able to improve the aperture ratio of the display device. Further, because the common electrode is directly connected to the common electrode line, it is able to optimize the connection between the common electrode and the common electrode line, thereby to improve the image quality.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a gate electrode, a gate line, a gate insulation layer, a source electrode, a drain electrode, a data line, a common electrode and a common electrode line which are arranged on a base substrate, wherein the common electrode line is directly connected to the common electrode,
wherein the common electrode line is arranged in a layer and made of a material identical to the source electrode, the drain electrode and the data line,
wherein two adjacent common electrode lines in a direction parallel to the gate line are electrically connected to each other through a jumper wire, the jumper wire is a metal wire, and arranged in a layer and made of a material identical to the gate electrode and the gate line,
wherein the jumper wire is arranged in an extension direction of the common electrode line electrically connected to the jumper wire,
wherein the two adjacent common electrode lines arranged in the direction parallel to the gate line are electrically connected to each other by the jumper wire through a first via-hole and a second via-hole, and the first via-hole and the second via-hole are arranged below the common electrode lines respectively and penerate through the gate insulation layer.

2. The array substrate according to claim 1, wherein a further common electrode line for connecting the common electrode line to the jumper wire is arranged within each of the first via-hole and the second via-hole.

3. The array substrate according to claim 1, wherein a further common electrode for connecting the common electrode line to the jumper wire is arranged within each of the first via-hole and the second via-hole.

4. A display device, comprising the array substrate according to claim 1.

5. A method for manufacturing an array substrate, the array substrate comprising a gate electrode, a gate line, a gate insulation layer, a source electrode, a drain electrode, a data line, a common electrode and a common electrode line which are arranged on a base substrate, wherein the method comprises;
forming the common electrode line and the common electrode directly connected to each other;
forming the source electrode, the drain electrode, the data line and the common electrode line through a single patterning process;
forming a jumper wire for electrically connecting two adjacent common electrode lines arranged in a direction parallel to the gate line;
forming the gate electrode, the gate line and the jumper wire through a single patterning process.

6. The method according to claim 5, further comprising forming a first via-hole and a second via-hole penetrating through the gate insulation layer, wherein the first via-hole and the second via-hole are arranged below the common electrode lines respectively, and the two adjacent common electrode lines arranged in the direction parallel to the gate line are electrically connected to each other by the jumper wire through the first via-hole and the second via-hole.

7. The method according to claim 6, wherein the step of forming the first via-hole and the second via-hole comprises, subsequent to the formation of the gate insulation layer, patterning the gate insulation layer to form the first via-hole and the second via-hole.

8. The method according to claim 7, wherein in the case of forming the common electrode line, the common electrode line is connected to the jumper wire through a further common electrode line formed in each of the first via-hole and the second via-hole.

9. The method according to claim 6, wherein the step of forming the first via-hole and the second via-hole comprises, subsequent to the formation of the common electrode line, patterning the gate insulation layer to form the first via-hole and the second via-hole.

10. The method according to claim 9, wherein in the case of forming the common electrode, the common electrode line is connected to the jumper wire through a further common electrode formed in each of the first via-hole and the second via-hole.

11. The method according to claim 5, wherein the common electrode line is arranged in a layer and made of a material identical to the source electrode, the drain electrode and the data line.

12. A method for manufacturing an array substrate, comprising:
Step S1 of providing a base substrate, and forming a gate line, a jumper wire and a gate electrode on the base substrate through a single patterning process;
Step S2 of forming a gate insulation layer provided with a via-hole on the base substrate obtained after Step S1;
Step S3 of forming a pattern of a semiconductor layer on the base substrate obtained after Step S2;
Step S4 of forming a source electrode, a drain electrode, a data line and a common electrode line on the base substrate obtained after Step S3;
Step S5 of forming a pattern of a common electrode on the base substrate obtained after Step S4;
Step S6 of forming a passivation layer with a via-hole on the base substrate obtained after Step S5; and
Step S7 of forming a pattern of a pixel electrode on the base substrate obtained after Step S6.

13. The method according to claim 12, wherein the common electrode line is arranged in a layer and made of a material identical to the source electrode, the drain electrode and the data line.

* * * * *